(12) United States Patent
Jeong et al.

(10) Patent No.: US 11,705,463 B2
(45) Date of Patent: Jul. 18, 2023

(54) TRANSISTOR ARRAY SUBSTRATE AND ELECTRONIC DEVICE INCLUDING SAME

(71) Applicant: LG Display Co., Ltd., Seoul (KR)

(72) Inventors: ChanYong Jeong, Paju-si (KR); Dohyung Lee, Paju-si (KR); JuHeyuck Baeck, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 86 days.

(21) Appl. No.: 17/113,845

(22) Filed: Dec. 7, 2020

(65) Prior Publication Data

US 2021/0183898 A1 Jun. 17, 2021

(30) Foreign Application Priority Data

Dec. 16, 2019 (KR) .................. 10-2019-0168156

(51) Int. Cl.
*H01L 27/14* (2006.01)
*H01L 27/12* (2006.01)
*H10K 59/131* (2023.01)

(52) U.S. Cl.
CPC ........ *H01L 27/124* (2013.01); *H01L 27/1262* (2013.01); *H10K 59/131* (2023.02)

(58) Field of Classification Search
CPC .............. H01L 27/124; H01L 27/1262; H01L 27/3276; H01L 27/1225; H01L 29/66969; H01L 29/78624; H01L 29/7869; H01L 29/42384; H01L 27/1214; H01L 27/3262; H01L 29/66742; H01L 29/786; H01L 27/1222; H01L 51/50; G09G 3/3233; H10K 59/131; H10K 59/1213; H10K 50/00

USPC ..................................................... 257/59, 72
See application file for complete search history.

(56) References Cited

U.S. PATENT DOCUMENTS

| | | | |
|---|---|---|---|
| 5,198,379 | A | 3/1993 | Adan |
| 7,256,457 | B2 * | 8/2007 | Hotta ................. H01L 27/1288 257/213 |
| 7,476,937 | B2 * | 1/2009 | Kawasaki ......... H01L 29/78603 257/E27.113 |
| 2006/0278875 | A1 | 12/2006 | Ohnuma et al. |
| 2007/0290227 | A1 | 12/2007 | Liang et al. |

FOREIGN PATENT DOCUMENTS

KR 10-2019-0053338 A 5/2019

OTHER PUBLICATIONS

European Patent Office, Extended European Search Report and Opinion, EP Patent Application No. 20214366.5, dated May 11, 2021, eight pages.

* cited by examiner

*Primary Examiner* — Tan N Tran
(74) *Attorney, Agent, or Firm* — Fenwick & West LLP

(57) ABSTRACT

Provided are a transistor array substrate and an electronic device. A first active layer includes a first area, a second area spaced apart from the first area, and a channel area provided between the first area and the second area. A gate insulating film is disposed on the first active layer. A gate electrode is disposed on the gate insulating film to overlap a portion of the channel area of the first active layer. The gate electrode overlaps a portion of at least one area of the first and second areas of the first active layer. Deteriorations in the channel area are prevented.

21 Claims, 15 Drawing Sheets

TRANSISTOR ARRAY SUBSTRATE AND ELECTRONIC DEVICE INCLUDING SAME

CROSS REFERENCE TO RELATED APPLICATIONS

This application claims priority from Republic of Korea Patent Application No. 10-2019-0168156, filed on Dec. 16, 2019, which is hereby incorporated by reference for all purposes as if fully set forth herein.

BACKGROUND

Field

Embodiments relate to a transistor array substrate and an electronic device including the same.

Description of Related Art

Along with the development of the information society, demand for a variety of types of electronic devices, such as display devices and lighting devices, is increasing. Such an electronic device may include a panel in which data lines and gate lines are disposed, a data driver driving the data lines, and a gate driver driving the gate lines.

In a panel serving as a key component of such an electronic device, a plurality of transistors having a variety of functions may be disposed to drive the panel.

Accordingly, a fabrication process of the panel may inevitably be complicated and difficult. When process convenience is pursued to overcome such problems, the device performance of the transistor may be disadvantageously degraded.

In particular, it may be difficult to design a plurality of transistors to have structures corresponding to different requirements for the transistors having different functions.

SUMMARY

Embodiments provide a transistor array substrate having a structure for preventing a short circuit between an active layer and a gate electrode and an electronic device including the same.

In addition, embodiments provide a transistor array substrate having a structure for preventing deteriorations in a channel area of the active layer, even in a case in which a high voltage is applied to an electrode connected to a power supply node, and an electronic device including the same.

In addition, embodiments provide a transistor array substrate having a structure for preventing mobility degradation and an electronic device including the same.

According to an aspect, embodiments may provide a transistor array substrate and an electronic device including the same, the electronic device including a panel including at least one transistor, and a driving circuit driving the panel. The panel includes a substrate, a first active layer disposed on the substrate, the first active layer including a first area, a second area spaced apart from the first area, and a channel area provided between the first area and the second area, a gate insulating film disposed on the first active layer, a gate electrode of the at least transistor disposed on the gate insulating film and overlapping a portion of the channel area of the first active layer, an interlayer insulating film disposed on the gate electrode, and a first electrode and a second electrode of the at least transistor disposed on the interlayer insulating film and spaced apart from each other. The gate electrode overlaps a portion of at least one area of the first area and the second area of the first active layer.

According to an aspect, embodiments may provide a transistor array substrate including a substrate, a first active layer disposed on the substrate, the first active layer including a first area, a second area spaced apart from the first area, and a channel area provided between the first area and the second area, a gate insulating film disposed on the first active layer, a gate electrode disposed on the gate insulating film and overlapping a portion of the channel area of the first active layer, an interlayer insulating film disposed on the gate electrode, and a first electrode and a second electrode disposed on the interlayer insulating film and spaced apart from each other. The gate electrode overlaps a portion of at least one area of the first area and the second area of the first active layer.

According to exemplary embodiments, in the transistor array substrate and the electronic device, the gate insulating film may be disposed such that the gate electrode does not contact the conductorized area of the active layer, thereby preventing a short circuit between the active layer and the gate electrode.

In addition, according to exemplary embodiments, in the transistor array substrate and the electronic device, a portion of the channel area is disposed in the area not overlapping the gate electrode, such that the channel area of the active layer is not deteriorated, even though a high voltage is applied to the electrode connected to the power supply node.

In addition, according to exemplary embodiments, in the transistor array substrate and the electronic device, the length of the channel area of the active layer is designed to be appropriate, such that mobility degradation may be prevented.

BRIEF DESCRIPTION OF THE DRAWINGS

The above and other objects, features, and advantages of the present disclosure will be more clearly understood from the following detailed description, taken in conjunction with the accompanying drawings.

DETAILED DESCRIPTION

Figure 1:
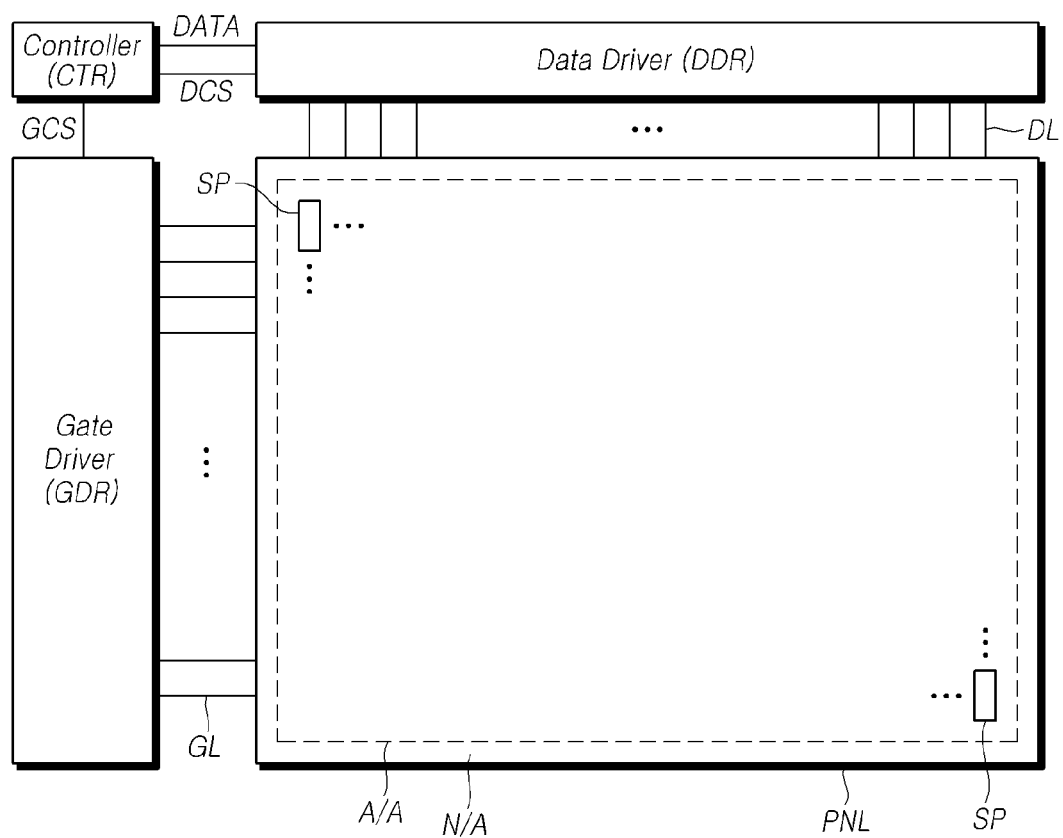
FIG. 1 is a diagram illustrating a schematic system configuration of an electronic device according to embodiments.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a diagram illustrating a schematic system configuration of an electronic device according to embodiments.

The electronic device according to embodiments may include a display device, a lighting device, an emitting device, and the like. The following description will mainly be focused on the display device for the sake of brevity. However, the following description may be applied not only to the display device, but also to various other electronic devices, such as the lighting device or the emitting device, in substantially the same manner, as long as transistors are included.

The electronic device according to embodiments may include a panel PNL displaying images or emitting light and a driving circuit driving the panel PNL.

In the panel PNL, a plurality of data lines DL and a plurality of gate lines GL may be disposed, and a plurality of subpixels SP defined by the plurality of gate lines GL and the plurality of data lines DL may be arrayed in the form of a matrix.

In the panel PNL, the plurality of data lines DL and the plurality of gate lines GL may be disposed to intersect each other. For example, the plurality of data lines DL may be arrayed in rows or columns, and the plurality of gate lines GL may be arrayed in columns or rows. Hereinafter, for the sake of brevity, the plurality of gate lines GL will be described as being disposed in rows, while the plurality of data lines DL will be described as being disposed in columns.

In the panel PNL, in addition to the plurality of data lines DL and the plurality of gate lines GL, other types of signal lines may be disposed, depending on the subpixel structure or the like. Driving voltage lines, reference voltage lines, common voltage lines, or the like may also be disposed in the panel PNL.

The panel PNL may be a variety of types of panels, such as a liquid crystal display (LCD) panel and an organic light-emitting diode (OLED) display panel.

The types of signal lines disposed in the panel PNL may vary depending on the subpixel structure, panel type (e.g. an LCD panel or an OLED panel). In addition, the term "signal line" as used herein may be a concept including electrodes to which signals are applied.

The panel PNL may include an active area A/A displaying images (videos) and a nonactive area N/A disposed at the periphery of the active area A/A so as not to display images. Herein, the nonactive area N/A is also referred to as a bezel area.

In the active area A/A, a plurality of subpixels SP for displaying images are disposed.

In the nonactive area N/A, pads may be disposed to be electrically connected to a data driver DDR, and a plurality of data link lines connecting the pads to the plurality of data lines DL may be disposed. The plurality of data link lines may be portions of the plurality of data lines DL extending into the nonactive area N/A or separate pattern portions electrically connected to the plurality of data lines DL.

In addition, in the nonactive area N/A, conducting lines related to gate driving may be disposed to deliver a voltage (signal) necessary for gate driving to the gate driver GDR through the pads electrically connected to the data driver DDR. For example, the conducting lines related to gate driving may include clock lines delivering clock signals, gate voltage lines delivering gate voltages VGH and VGL, gate driving control signal lines delivering a variety of control signals necessary for generation of a scan signal, and the like. Such conducting lines related to gate driving are disposed in the nonactive area N/A, in a manner different from the gate lines GL disposed in the active area A/A.

The driving circuit may include the data driver DDR driving the plurality of data lines DL, the gate driver GDR driving the plurality of gate lines GL, a controller CTR controlling the data driver DDR and the gate driver GDR, and the like.

The data driver DDR may drive the plurality of data lines DL by outputting a data voltage to the plurality of data lines DL.

The gate driver GDR may drive the plurality of gate lines GL by outputting a scan signal to the plurality of gate lines GL.

The controller CTR may control the operations of the data driver DDR and the gate driver GDR by supplying a variety of control signals DCS and GCS necessary for the driving operations of the data driver DDR and the gate driver GDR. In addition, the controller CTR may supply image data DATA to the data driver DDR.

The controller CTR starts scanning at times (or points in time) defined by frames, converts image data received from an external source into a data signal format readable by the data driver DDR and outputs converted image data DATA, and controls the data driving at appropriate times according to the scanning.

The controller CTR receives a variety of timing signals, such as a vertical synchronization signal Vsync, a horizontal synchronization signal Hsync, an input data enable signal DE, and a clock signal CLK, from an external source (e.g. a host system), generates a variety of control signals, and outputs the control signals to the data driver DDR and the gate driver GDR in order to control the data driver DDR and the gate driver GDR.

For example, the controller CTR outputs a variety of gate control signals GCS, including a gate start pulse GSP, a gate shift clock signal GSC, a gate output enable signal GOE, and the like, to control the gate driver GDR.

In addition, the display controller 140 outputs a variety of data control signals DCS, including a source start pulse SSP, a source sampling clock SSC, a source output enable signal SOE, and the like, to control the data driver DDR.

The controller CTR may be a timing controller used in typical display technology or may be a control device including a timing controller and able to perform other control functions.

The controller CTR may be provided as a component separate from the data driver DDR or may be provided as an integrated circuit (IC) together with the data driver DDR.

The data driver DDR drives the plurality of data lines DL by receiving the image data DATA from the controller CTR and supplying a data voltage to the plurality of data lines DL. Herein, the data driver DDR will also be referred to as a source driver.

The data driver DDR may transmit and receive a variety of signals to and from the controller CTR via a variety of interfaces.

The gate driver GDR sequentially drives the plurality of gate lines GL by sequentially supplying the scan signal to the plurality of gate lines GL. Herein, the gate driver GDR will also be referred to as a scan driver.

The gate driver GDR sequentially supplies the scan signal having an on or off voltage to the plurality of gate lines GL under the control of the controller CTR.

When a specific gate line is opened by the gate driver GDR, the data driver DDR converts the image data DATA, received from the controller CTR, into an analog data voltage, and supplies the analog data voltage to the plurality of data lines DL.

The data driver DDR may be located on one side of (above or below) the panel PNL, or in some cases, on both sides of (e.g. above and below) the panel PNL, depending on the driving method, the design of the panel, or the like.

The gate driver GDR may be located on one side (e.g. to the left or right) of the panel PNL, or in some cases, on both sides (e.g. to the left and right) of the panel PNL, depending on the driving method, the design of the panel, or the like.

The data driver DDR may include one or more source driver integrated circuits (SDICs).

Each of the SDICs may include a shift register, a latch circuit, a digital-to-analog converter (DAC), an output buffer, and the like. In some cases, the data driver DDR may further include an analog-to-digital converter (ADC).

Each of the SDICs may be connected to a bonding pad of the panel PNL by a tape-automated bonding (TAB) method or a chip-on-glass (COG) method or may be directly disposed on the panel PNL. In some cases, the SDICs may be provided as integrated portions of the panel PNL. In addition, each of the SDICs may be implemented using a chip-on-film (COF) method. In this case, each of the SDICs may be mounted on a circuit film to be electrically connected to the data lines DL in the panel PNL via the circuit film.

The gate driver GDR may include a plurality of gate driving circuits (GDC). The plurality of gate driving circuits may correspond to the plurality of gate lines GL, respectively.

Each of the gate driving circuits may include a shift register, a level shifter, and the like.

Each of the gate driving circuits may be connected to a bonding pad of the panel PNL by a TAB method or a COG method. In addition, each of the gate driving circuits may be implemented using a COF method. In this case, each of the gate driving circuits may be mounted on a circuit film to be electrically connected to the gate lines GL in the panel PNL via the circuit film. In addition, each of the gate driving circuits may be implemented using a gate-in-panel (GIP) method disposed inside of the panel PNL. That is, each of the gate driving circuits may be directly provided in the panel PNL.

Figure 2:
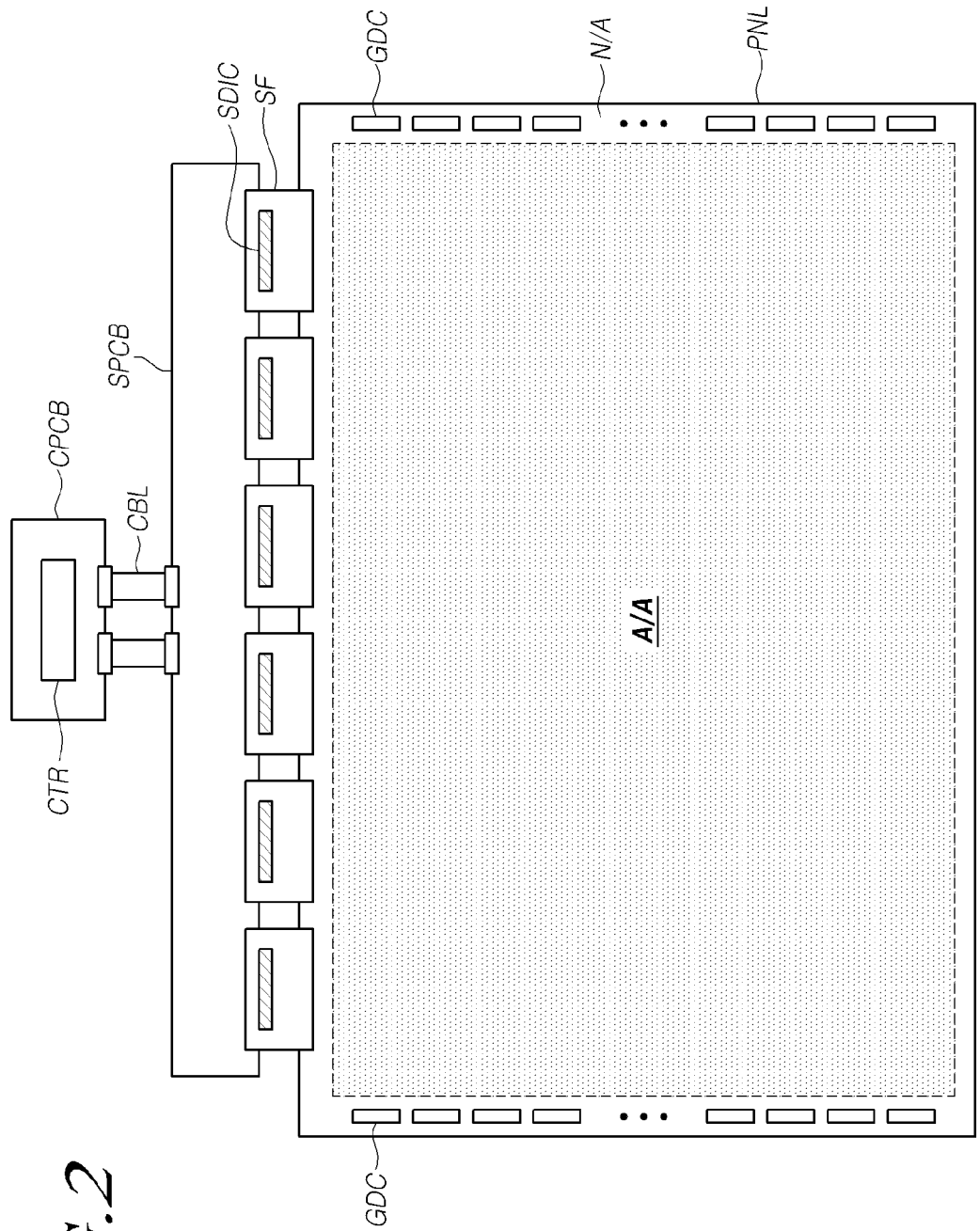
FIG. 2 is a diagram illustrating a system configuration of the electronic device according to embodiments.

FIG. 2 is a diagram illustrating a system configuration of the electronic device according to embodiments.

Referring to FIG. 2, in the electronic device according to embodiments, the data driver DDR may be implemented using the COF method from among a variety of methods, such as the TAB method, the COG method, and the COF method, while the gate driver GDR may be implemented using the GIP method from among a variety of methods, such as the TAB method, the COG method, the COF method, and the GIP method.

The data driver DDR may be implemented as one or more source driver integrated circuits SDIC. FIG. 2 illustrates a case in which the data driver DDR is implemented as a plurality of source driver integrated circuits SDIC.

In a case in which the data driver DDR is a COF type, each of the source driver integrated circuits SDIC, of which the data driver DDR is constituted, may be mounted on a source-side circuit film SF.

One portion of the source-side circuit film SF may be electrically connected to a pad set (i.e. a set of pads) present in the nonactive area N/A of the panel PNL.

Conducting lines electrically connecting the source driver integrated circuit SDIC and the panel PNL may be disposed on the source-side circuit film SF.

The electronic device may include at least one source printed circuit board SPCB and a control printed circuit board CPCB, on which control components and a variety of electric devices are mounted, for circuit connection between the plurality of source driver integrated circuits SDIC and other devices.

The other portion of the source-side circuit film SF, with the source driver integrated circuits SDIC being mounted thereon, may be connected to the at least one source printed circuit board SPCB.

That is, one portion of the source-side circuit film SF, on which the source driver integrated circuits SDIC is mounted, may be electrically connected to the nonactive area N/A, while the other portion of the source-side circuit film SF may be electrically connected to the source printed circuit board SPCB.

The controller CTR controlling the operations of the data driver DDR, the gate driver GDR, and the like may be disposed in the control printed circuit board CPCB.

In addition, a power management integrated circuit (PMIC) or the like may be further disposed on the control printed circuit board CPCB. The power management integrated circuit supplies various forms of voltage or current to the panel PNL, the data driver DDR, the gate driver GDR, and the like or controls various forms of voltage or current to be supplied thereto.

The source printed circuit board SPCB and the control printed circuit board CPCB may be circuit-connected via at least one connecting member CBL. The connecting member CBL may be, for example, a flexible printed circuit (FPC), a flexible flat cable (FFC), or the like.

The at least one source printed circuit board SPCB and the control printed circuit board CPCB may be may be integrated into a single PCB.

In a case in which the gate driver GDR is a GIP type, a plurality of gate driving circuits GDC included in the gate driver GDR may be directly provided on the nonactive area N/A of the panel PNL.

Each of the gate driving circuits GDC may output a corresponding scan signal to the corresponding gate line GL disposed in the active area A/A of the panel PNL.

The plurality of gate driving circuits GDC disposed in the panel PNL may be supplied with a variety of signals (e.g. a clock signal, a high-level gate voltage VGH, a low-level gate voltage VGL, a start signal VST, and a reset signal) necessary for the generation of the scan signal, through the gate driving-related conducting lines disposed in the nonactive area N/A.

The gate driving-related conducting lines disposed in the nonactive area N/A may be electrically connected to the source-side circuit films SF disposed most adjacent to the plurality of gate driving circuits GDC.

Figure 3:
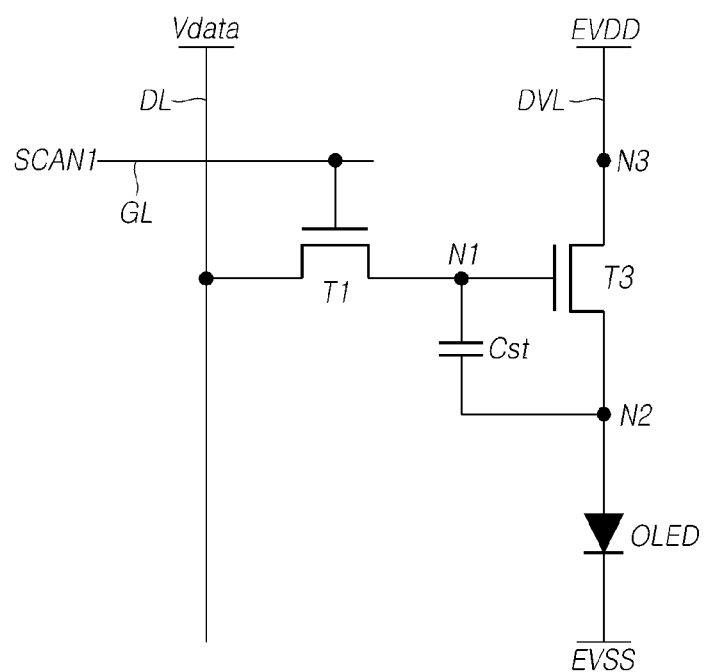
FIG. 3 is a diagram illustrating a structure of a subpixel in a case in which the panel is an organic light-emitting diode (OLED) panel according to an embodiment.

FIG. 3 is a diagram illustrating a structure of each of the subpixels SP in a case in which the panel PNL is an organic light-emitting diode (OLED) panel according to an embodiments.

Referring to FIG. 3, each of the subpixels SP in the OLED panel PNL may further include a first transistor T1 delivering a data voltage Vdata to a first node N1 corresponding to a gate node of a driving transistor T3, and a storage capacitor Cst maintaining the data voltage Vdata corresponding to an image signal voltage or a voltage corresponding to the data voltage Vdata during a one-frame period.

An organic light-emitting diode OLED may include a first electrode (i.e. an anode or a cathode), an organic layer including at least one emissive layer, a second electrode (i.e. a cathode or an anode), and the like.

The driving transistor T3 drives the organic light-emitting diode OLED by supplying a driving current to the organic light-emitting diode OLED.

The driving transistor T3 includes the first node N1, a second node N2, a third node N3, and the like.

The first node N1 of the driving transistor T3 is a node corresponding to a gate node, and may be electrically connected to a source node or a drain node of the first transistor T1.

The second node N2 of the driving transistor T3 may be electrically connected to a first electrode 301 of the organic light-emitting diode OLED and may be a source node or a drain node.

The third node N3 of the driving transistor T3 is a node to which a driving voltage EVDD is applied. The third node N3 may be electrically connected to a driving voltage line DVL, through which the driving voltage EVDD is supplied, and may be a drain node or a source node.

Each of the driving transistor T3 and the first transistor T1 may be an N-type transistor or a P-type transistor.

The first transistor T1 may be electrically connected between a data line DL and the first node N1 of the driving transistor T3 and may be controlled by a first scan signal SCAN1 applied to the gate node through a gate line.

The first transistor T1 may be turned on by the first scan signal SCAN1 to deliver the data voltage Vdata, supplied through the data line DL, to the first node N1 of the driving transistor T3.

The storage capacitor Cst may be electrically connected to the first node N1 and the second node N2 of the driving transistor T3.

The storage capacitor Cst is an external capacitor intentionally designed to be disposed externally of the driving transistor T3, rather than a parasitic capacitor (e.g. Cgs or Cgd), i.e. an internal capacitor present between the first node N1 and the second node N2 of the driving transistor T3.

The subpixel structure illustrated in FIG. 3 has a 2T1C structure comprised of two transistors and a single capacitor, and is merely an example provided for the sake of explanation. The subpixel structure may further include one or more transistors, or in some cases, one or more capacitors. Each of the plurality of subpixels may have the same structure, or some of the plurality of subpixels may have a different structure.

Figure 4:
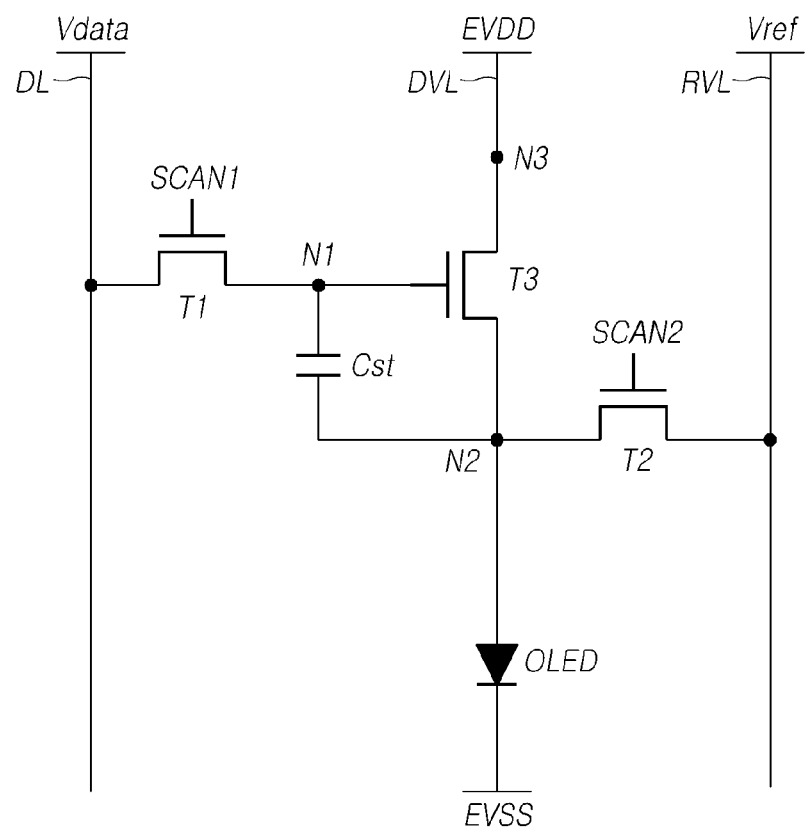
FIG. 4 is a diagram illustrating a 3T1C structure comprised of three transistors and a single capacitor, in which a single subpixel further includes a second transistor electrically connected to a second node of a driving transistor and a reference voltage line according to an embodiment.

FIG. 4 is a diagram illustrating a 3T1C structure comprised of three transistors and a single capacitor, in which a single subpixel SP further includes a second transistor T2 electrically connected to the second node N2 of the driving transistor T3 and a reference voltage line RVL.

Referring to FIG. 4, the second transistor T2 may be electrically connected to the second node N2 of the driving transistor T3 and the reference voltage line RVL to be on-off controlled by a second scan signal SCAN2 applied to the gate node.

The drain node or the source node of the second transistor T2 may be electrically connected to the reference voltage line RVL, and the source node or the drain node of the second transistor T2 may be electrically connected to the second node N2 of the driving transistor T3.

For example, the second transistor T2 may be turned on in a display driving time segment or may be turned on in a sensing driving time segment in which characteristics of the driving transistor T3 or characteristics of the organic light-emitting diode OLED are sensed.

The second transistor T2 may be turned on by the second scan signal SCAN2 at a corresponding driving time (e.g. a display driving time or a voltage initialization time within the sensing driving time segment) to deliver a reference voltage Vref, supplied through the reference voltage line RVL, to the second node N2 of the driving transistor T3.

In addition, the second transistor T2 may be turned on by the second scan signal SCAN2 at a corresponding driving time (e.g. a sampling time within the sensing driving time segment) to deliver a voltage of the second node N2 of the driving transistor T3 to the reference voltage line RVL.

That is, the second transistor T2 may control the voltage state of the second node N2 of the driving transistor T3 or deliver the voltage of the second node N2 of the driving transistor T3 to the reference voltage line RVL.

Here, the reference voltage line RVL may be electrically connected to an analog-to-digital converter (ADC) that senses a voltage of the reference voltage line RVL, converts the sensed voltage into a digital value, and outputs sensing data including the digital value.

The analog-to-digital converter may be included within each of the source driver integrated circuits SDICs of which the data driver DDR is constituted.

The sensing data output from the analog-to-digital converter may be used to sense characteristics (e.g. a threshold voltage or mobility) of the driving transistor T3 or characteristics (e.g. a threshold voltage) of the light-emitting diode OLED.

In addition, the storage capacitor Cst may be an external capacitor intentionally designed to be disposed externally of the driving transistor T3, rather than a parasitic capacitor (e.g. Cgs or Cgd), i.e. an internal capacitor present between the first node N1 and the second node N2 of the driving transistor T3.

Each of the driving transistor T3, the first transistor T1, and the second transistor T2 may be an N-type transistor or a P-type transistor.

In addition, the first scan signal SCAN1 and the second scan signal SCAN2 may be separate gate signals. In this case, the first scan signal SCAN1 and the second scan signal SCAN2 may be applied to the gate node of the first transistor T1 and the gate node of the second transistor T2 respectively through different gate lines.

In some cases, the first scan signal SCAN1 and the second scan signal SCAN2 may be the same gate signal. In this case, the first scan signal SCAN1 and the second scan signal SCAN2 may be commonly applied to the gate node of the first transistor T1 and the gate node of the second transistor T2 through a single gate line (or common gate line).

The subpixel structures illustrated in FIGS. 3 and 4 are merely examples provided for the sake of explanation. Each of the subpixel structures may further include one or more transistors or one or more capacitors in some cases.

In addition, each of the plurality of subpixels may have the same structure, or some of the plurality of subpixels may have a different structure.

Figure 5:
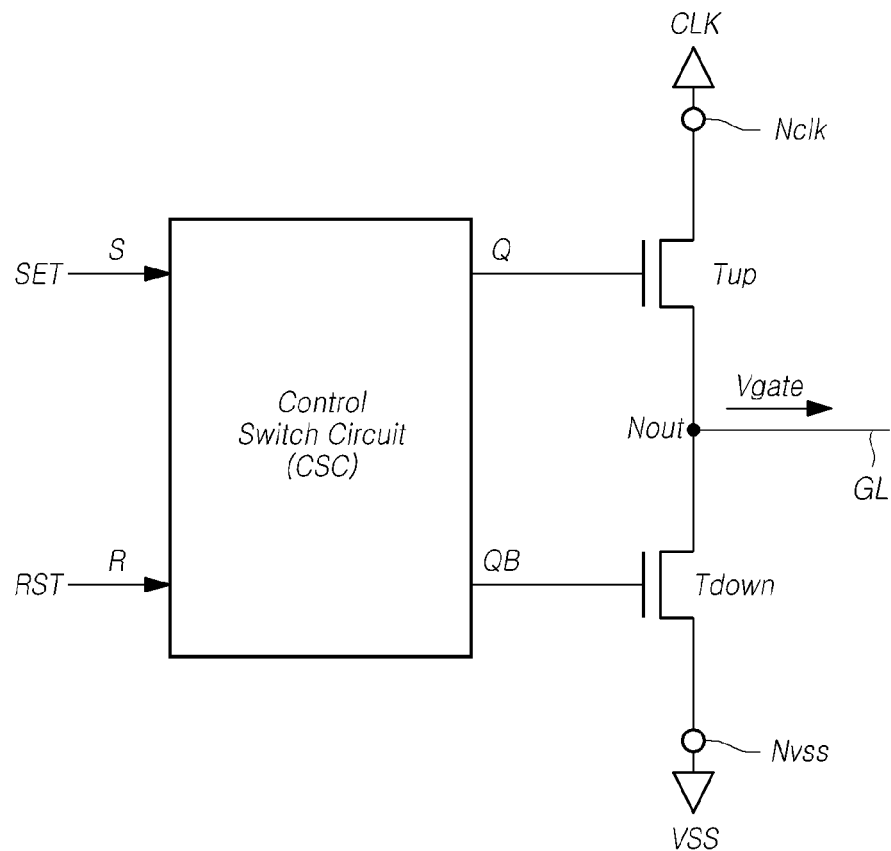
FIG. 5 is a diagram schematically illustrating each of the gate driving circuits disposed in the panel according to embodiments.

FIG. 5 is a diagram schematically illustrating each of the gate driving circuits GDC disposed in the panel PNL according to embodiments.

Referring to FIG. 5, each of the gate driving circuits GDC may include a pull-up transistor Tup, a pull-down transistor Tdown, a control switch circuit CSC, and the like.

The control switch circuit CSC may be a circuit controlling a voltage of a node Q corresponding to the gate node of the pull-up transistor Tup and a voltage of a node QB corresponding to the gate node of the pull-down transistor Tdown. The control switch circuit CSC may include a plurality of switches (transistors).

The pull-up transistor Tup is a transistor supplying a gate signal Vgate corresponding to a first level voltage (e.g. a high-level voltage VGH) to a gate line GL through a gate signal output node Nout. The pull-down transistor Tdown is a transistor supplying the gate signal corresponding to a second level voltage (e.g. a low-level voltage VGL) to the gate line GL through the gate signal output node Nout. The pull-up transistor Tup and the pull-down transistor Tdown may be turned on at different times.

The pull-up transistor Tup is electrically connected to a clock signal application node Nclk to which a clock signal CLK is applied and a gate signal output node Nout electrically connected to the gate line GL, and is turned on or off by a voltage in the node Q.

The gate node of the pull-up transistor Tup is electrically connected to the node Q. The drain node or the source node of the pull-up transistor Tup is electrically connected to the clock signal application node Nclk. The source node or the drain node of the pull-up transistor Tup is electrically connected to the gate signal output node Nout, from which the gate signal Vgate is output.

The pull-up transistor Tup is turned on by the voltage of the node Q to output the gate signal Vgate, having the high-level voltage VGH in a high-level segment of the clock signal CLK, through the gate signal output node Nout.

The gate signal Vgate of the high-level voltage VGH, output through the gate signal output node Nout, is supplied to the corresponding gate line GL.

The pull-down transistor Tdown is electrically connected to the gate signal output node Nout and a base voltage node Nvss, and is turned on or off by the voltage of the node QB.

The gate node of the pull-down transistor Tdown is electrically connected to the node QB. The drain node or the source node of the pull-down transistor Tdown is electrically connected to the base voltage node Nvss to receive a base voltage VSS corresponding to a constant voltage. The source node or the drain node of the pull-down transistor Tdown is electrically connected to the gate signal output node Nout, through which the gate signal Vgate is output.

The pull-down transistor Tdown is turned on by the voltage of the node QB to output the gate signal Vgate having the low-level voltage VGL through the gate signal output node Nout. Consequently, the gate signal Vgate having the low-level voltage VGL may be supplied to the corresponding gate line GL through the gate signal output node Nout. The gate signal Vgate of the low-level voltage VGL may be, for example, the base voltage VSS.

In addition, the control switch circuit CSC may be comprised of two or more transistors or the like, and includes major nodes, such as the node Q, the node QB, a set node (also referred to as a start node) S, and a reset node R. In some cases, the control switch circuit CSC may further include, for example, an input node, through which a variety of voltages, such as a driving voltage VDD, are input.

In the control switch circuit CSC, the node Q is electrically connected to the gate node of the pull-up transistor Tup, and is repeatedly charged and discharged.

In the control switch circuit CSC, the node QB is electrically connected to the gate node of the pull-down transistor Tdown, and is repeatedly charged and discharged.

In the control switch circuit CSC, the set node S receives a set signal SET applied thereto, the set signal SET indicating the start of gate driving of the corresponding gate driving circuit GDC.

Here, the set signal SET applied to the set node S may be a start signal VST input externally from the gate driver GDR or a signal (e.g. a carry signal) to which the gate signal Vgate output from the gate driving circuit GDC in a previous stage, prior to the stage of the present gate driving circuit GDC, is fed back.

In the control switch circuit CSC, a reset signal RST applied to the reset node R may be a reset signal for initializing the gate driving circuits GDC of all stages or a carry signal input from another stage (e.g. a previous or following stage).

The control switch circuit CSC charges the node Q in response to the set signal SET and discharges the node Q in response to the reset signal RST. The control switch circuit CSC may include an inverter circuit to charge or discharge the node Q and the node QB at different times.

As illustrated in FIG. 3, the driving transistor T3 and a switching transistor T1 (first transistor) may be disposed in each of the plurality of subpixels SP in the active area A/A of the panel PNL corresponding to the OLED panel. However, the present embodiments are not limited thereto, and three or more transistors may be disposed in the active area A/A of the OLED panel PNL, as illustrated in FIG. 4.

In addition, as illustrated in FIG. 2, in a case in which the gate driving circuits GDC are INS1P circuits, i.e. the gate driving circuits GDC are disposed within the panel PNL, a variety of transistors (e.g. the pull-up transistor Tup, the pull-down transistor Tdown, and transistors within the control switch circuit CSC), of which each of the gate driving circuits GDC as illustrated in FIG. 5 is constituted, may be disposed in the nonactive area N/A located at the periphery of the active area A/A of the panel PNL.

Figure 6:
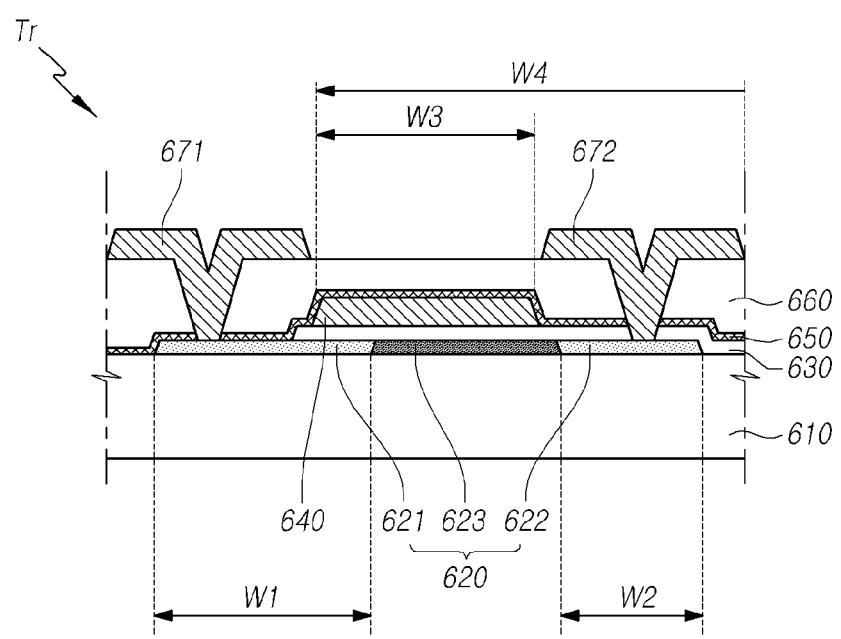
FIG. 6 is a cross-sectional view illustrating a transistor disposed in the electronic device according to embodiments.

FIG. 6 is a cross-sectional view illustrating a transistor disposed in the electronic device according to embodiments.

Referring to FIG. 6, the electronic device according to embodiments may include at least one transistor Tr.

The transistor Tr may include a first active layer 620, a gate electrode 640, a first electrode 671, and a second electrode 672.

As illustrated in FIG. 6, the first active layer 620 including a first area 621, a second area 622, and a channel area 623 is disposed on a substrate 610, and a gate insulating film 630 may be disposed on the first active layer 620. The gate electrode 640 may be disposed on the gate insulating film 630, and an insulating film 650 may be disposed on the substrate 610 on which the gate electrode 640 is disposed. An interlayer insulating film 660 is disposed on the insulating film 650, and the first and second electrodes 671 and 672 spaced apart from each other may be disposed on the interlayer insulating film 660.

Here, one of the first electrode 671 and the second electrode 672 may be electrically connected to a power supply node of the electronic device.

The following description will mainly be focused on a configuration in which the second electrode 672 is connected to the power supply node, for the sake of brevity.

After the fabrication of a module of the electronic device including the transistor Tr, high-speed driving of which is required, a high voltage (e.g. 35V or higher) may be applied to the transistor Tr, more particularly, the second electrode 672 connected to the power supply node, in an aging step for testing for a defect in the transistor Tr. Here, a voltage applied to the gate electrode 640 may be 0V.

In a case in which the transistor Tr is driven under the above-described conditions, a strong electric field is applied to the transistor Tr, such that the channel area 623 adjacent to the second area 622 of the first active layer 620 may be deteriorated. This may cause a defect in the conduction band and the adjacent regions of the first active layer 620, thereby decreasing the on-current of the transistor Tr and changing the threshold voltage Vth of the transistor Tr. Accordingly, the reliability of the transistor Tr may be lowered.

This may be caused by the reduced thickness of the gate insulating film 630 located between the gate electrode 640 and the channel area 623. According to a typical transistor structure, the gate insulating film may be disposed to overlap the gate electrode and the channel area of the active layer. The cross-section of the gate insulating film may have a positive taper shape, such that the thickness of the gate insulating film may decrease in the direction toward an edge of the gate insulating film.

As described above, the channel area of the area corresponding to the thickness-reduced area of the gate insulating film, present between the gate electrode and the channel area of the active layer may be deteriorated, thereby degrading the reliability of the transistor, which is problematic.

The transistor Tr provided in the electronic device according to embodiments may have a structure for preventing the channel area of the active layer of each of the transistor Tr, the high-speed driving of which is required, and the transistor Tr subjected to aging from being deteriorated.

Specifically, the first active layer 620 of the transistor Tr may be disposed on the substrate 610.

Although not illustrated in FIG. 6, at least one buffer layer may be disposed between the substrate 610 and the first active layer 620.

The buffer layer may contain an inorganic insulating material, such as silicon oxide (SiOx), silicon nitride (SiNx), or silicon oxynitride (SiON), but the present disclosure is not limited thereto.

In addition, in a case in which the buffer layer has a multilayer structure, the buffer layer may have a structure in which layers respectively containing at least two inorganic insulating materials, selected from among SiOx, SiNx, and SiON, alternate with each other, but the present disclosure is not limited thereto.

The first active layer 620 may be made of an oxide semiconductor. The material of the first active layer 620 may be a metal oxide semiconductor containing one selected from among oxides of metals, such as zinc (Zn), indium (In), gallium (Ga), tin (Sn), and titanium (Ti), and combinations of metals, such as Zn, In, Ga, Sn, and Ti, and oxides thereof.

For example, the first active layer 620 may contain at least one selected from among zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO), but the present disclosure is not limited thereto.

Such an oxide semiconductor is advantageously applicable to a large-area electronic device, compared to silicon (Si) semiconductor.

The first active layer 620 may include the first area 621, the second area 622 spaced apart from the first area 621, and the channel area 623 provided between the first area 621 and the second area 622.

The first area 621 and the second area 622 of the first active layer 620 may be a conductorized area (i.e. an area processed to be conductive). Thus, electric resistance of each of the first area 621 and the second area 622 of the first active layer 620 may be lower than electric resistance of the channel area 623.

In a case in which the transistor Tr is in an on state, electric charges may move through the channel area 623 of the first active layer 620.

The width W1 of the first area 621 of the first active layer 620 may differ from the width W2 of the second area 622 of the first active layer 620. For example, as illustrated in FIG.

6, the width W1 of the first area 621 of the first active layer 620 may be greater than the width W2 of the second area 622 of the first active layer 620.

The gate insulating film 630 may be disposed on the first active layer 620.

The gate insulating film 630 may contain an inorganic insulating material, such as SiOx, SiNx, or SiON, but the present disclosure is not limited thereto.

As illustrated in FIG. 6, the gate insulating film 630 may be disposed to expose a portion of the first active layer 620. For example, the gate insulating film 630 may be disposed to expose a portion of the first area 621 of the first active layer 620.

The gate insulating film 630 may overlap the entirety of the channel area 623 of the first active layer 620. In addition, the gate insulating film 630 may overlap the entirety of one of the first area 621 and the second area 622 of the first active layer 620 and overlap a portion of the other area.

For example, as illustrated in FIG. 6, the gate insulating film 630 may overlap a portion of the first area 621 of the first active layer 620 and overlap the entirety of the second area 622 of the first active layer 620.

In addition, the gate insulating film 630 may be disposed to surround the top surface and the side surfaces of the second area 622 of the first active layer 620. As illustrated in FIG. 6, the gate insulating film 630 may extend in a direction in which the second area 622 extends from the channel area 623 while being disposed to cover the second area 622 of the first active layer 620. In the present disclosure, the gate insulating film 630 may have a structure for covering the second area 622 of the first active layer 620.

In the gate insulating film 630 as described above, the material of the gate insulating film 630 provided on the substrate 610 may be patterned by dry etching, so that a portion of the first area 621 of the first active layer 620 is finally exposed.

In the process of dry-etching the material of the gate insulating film 630, a partial area of the first active layer 620 may be conductorized. Specifically, an area of the first active layer 620 provided in an area not overlapping the gate insulating film 630 may be conductorized.

That is, the first area 621, one of conductorized areas of the first active layer 620, may include an area that does not overlap the gate insulating film 630.

The gate electrode 640 of the transistor Tr may be disposed on the gate insulating film 630.

The composition of the gate electrode 640 may include one selected from among aluminum (Al), gold (Au), silver (Ag), copper (Cu), tungsten (W), molybdenum (Mo), chromium (Cr), tantalum (Ta), titanium (Ti), and alloys thereof, but the present disclosure is not limited thereto.

On the cross-section, one end and the other end of the gate electrode 640 may be disposed on the top surface of the gate insulating film 630.

The width W3 of the gate electrode 640 may be smaller than the width W4 of the gate insulating film 630. The width W3 of the gate electrode 640 and the width W4 of the gate insulating film 630 may be minimum lengths in a direction perpendicular to a direction in which the gate insulating film 630 and the gate electrode 640 are stacked.

The gate electrode 640 may overlap the first active layer 620.

Specifically, the gate electrode 640 may overlap a portion of the channel area 623 of the first active layer 620 and overlap a portion of one of the first area 621 and the second area 622 of the first active layer 620.

For example, as illustrated in FIG. 6, the gate electrode 640 may overlap a portion of the channel area 623 of the first active layer 620 and overlap a portion of the first area 621 of the first active layer 620. The gate electrode 640 may overlap a boundary between the channel area 623 and the first area 621 of the first active layer 620. In addition, the gate electrode 640 may overlap the second area 622 of the first active layer 620.

That is, the gate electrode 640 may overlap a portion of the channel area 623 of the first active layer 620.

Thus, the channel area 623 of the first active layer 620 may be disposed to be offset from the center of the gate electrode 640, in a direction in which the second area 622 extends from the channel area 623 of the first active layer 620.

That is, the channel area 623 of the first active layer 620 may be disposed asymmetrically about the center of the gate electrode 640.

In addition, the gate insulating film 630 may overlap the entirety of the channel area 623 of the first active layer 620 and overlap a portion of the first area 621 of the first active layer 620. In this structure, one end of the gate insulating film 630 may be disposed to be more offset from the center of the gate electrode 640 than one end of the gate electrode 640, in a direction in which the first area 621 extends from the channel area 623.

That is, the width of the area in which the gate insulating film 630 overlaps the first area 621 of the first active layer 620 may be greater than the width of the area in which the gate electrode 640 overlaps the first area 621 of the first active layer 620. Here, the width of the area in which the gate insulating film 630 overlaps the first area 621 of the first active layer 620 and the width of the area in which the gate electrode 640 overlaps the first area 621 of the first active layer 620 may be minimum lengths in a direction perpendicular to the direction in which the first active layer 620 and the gate insulating film 630 are stacked.

Since one end of the gate insulating film 630 is disposed to be more offset from the center of the gate electrode 640 than one end of the gate electrode 640, in the direction in which the first area 621 extends from the channel area 623, as described above, one end of the gate electrode 640 may be separated from the first area 621 of the first active layer 620 by the gate insulating film 630. Accordingly, it is possible to prevent a short circuit from being generated by the contact between the gate electrode 640 and the first area 621, i.e. the conductorized area, due to a process error or the like.

The insulating film 650 may be disposed on the substrate 610 on which the gate electrode 640 is disposed.

Here, the insulating film 650 may contain an inorganic insulating material, such as SiOx, SiNx, or SiON. For example, the insulating film 650 may be SiNx.

Such an insulating film 650 may contain hydrogen.

Hydrogen contained in the insulating film 650 may serve to supply hydrogen to the first and second areas 621 and 622 of the first active layer 620 disposed below the insulating film 650.

In addition, the amount of electric charges of a thin-film transistor including an oxide semiconductor may be determined by the content of hydrogen with respect to the metal composition contained in an oxide semiconductor. Since hydrogen in the oxide semiconductor may act as carriers, the mobility of electric charges may be greater as the hydrogen content is higher.

The supply of hydrogen to the first and second areas 621 and 622 of the first active layer 620 by the insulating film 650 as described above may increase the mobility of electric charges in the first and second areas 621 and 622 of the first active layer 620. That is, the insulating film 650 may serve to conductorize the first and second areas 621 and 622 of the first active layer 620.

Due to the insulating film 650, the first area 621 of the first active layer 620 conductorized in the dry etching of the gate insulating film 630 may extend to an area below the gate electrode 640. That is, the area of the first area 621 conductorized in the process of fabricating the gate insulating film 630 may be increased by hydrogen diffused from the insulating film 650, so that the first area 621, i.e. the conductorized area, may be provided in not only an area not overlapping the gate insulating film 630 but also areas below the gate insulating film 630 and the gate electrode 640.

In addition, the insulating film 650 may conductorize the other area of the first active layer 620 that has not been conductorized in the dry etching of the gate insulating film 630.

For example, the second area 622 being one edge of the first active layer 620 while being spaced apart from the first area 621 of the first active layer 620 may be conductorized by hydrogen diffusion through the gate insulating film 630 due to the insulating film 650.

However, since a portion of the first area 621 of the first active layer 620 is in direct contact with the insulating film 650 and the gate insulating film 630 is disposed between the second area 622 of the first active layer 620 and the insulating film 650, the amount of hydrogen diffusing into the first area 621 may differ from the amount of hydrogen diffusing into the second area 622.

In addition, the channel area 623 integrated with the second area 622, with the hydrogen content thereof being lower than each of the first and second areas 621 and 622, may also be provided in an area not overlapping the gate electrode 640.

In a portion of the first active layer 620 overlapping the gate electrode 640, hydrogen diffusing from the insulating film 650 may be blocked by the gate electrode 640 so as not to arrive at the first active layer 620.

Thus, a portion of the area of the first active layer 620 overlapping a portion of the gate electrode 640 may not be supplied with hydrogen serving as carriers, thereby forming the channel area 623 having higher electric resistance than each of the first and second areas 621 and 622.

That is, one portion of the channel area 623 of the first active layer 620 may overlap a portion of the gate electrode 640, and another portion of the channel area 623 may be provided between one edge of the gate electrode 640 and the second area 622 of the first active layer 620.

Accordingly, the channel area 623 of the first active layer 620 may be disposed asymmetrically about the center of the gate electrode 640.

The position of the channel area 623 of the first active layer 620 resulting from the effect of conductorization due to the insulating film 650 may be specifically described in detail later with reference to FIGS. 7 to 10.

The interlayer insulating film 660 may be disposed on the insulating film 650.

The interlayer insulating film 660 may contain an inorganic insulating material, such as SiOx, SiNx, or SiON. For example, the insulating film 650 may be SiNx.

The first electrode 671 and the second electrode 672 of the transistor Tr, spaced apart from each other, may be disposed on the interlayer insulating film 660.

One of the first electrode 671 and the second electrode 672 may be a source electrode of the transistor Tr, while the other one of the first electrode 671 and the second electrode 672 may be a drain electrode of the transistor Tr.

For example, the first electrode 671 may be the source electrode of the transistor Tr, and the second electrode 672 may be the drain electrode of the transistor Tr. However, the present disclosure is not limited thereto. The first electrode 671 may be the drain electrode of the transistor Tr, and the second electrode 672 may be the source electrode of the transistor Tr.

The first electrode 671 may be connected to the first area 621 of the first active layer 620 via a contact hole provided in the interlayer insulating film 660 and the insulating film 650. The second electrode 672 may be connected to the second area 622 of the first active layer 620 via a contact hole provided in the interlayer insulating film 660, the insulating film 650, and the gate insulating film 630.

As described above, the second electrode 672 of the transistor Tr may be electrically connected to the power supply node of the electronic device.

In driving of the transistor Tr according to embodiments, even in a case in which a high voltage is applied to the second electrode 672, the gate insulating film 630 may be disposed to overlap the entirety of the channel area 623 and the second area 622 and to surround the top surface and one side surface of the second area 622, so that the channel area 623 adjacent to the second area 622 of the first active layer 620 connected to the second electrode 672 is not deteriorated.

Accordingly, this may overcome the problem of degraded reliability in the transistor Tr due to the deterioration of the channel area 623 caused by the reduced thickness of the gate insulating film 630 present between the gate electrode 640 and the channel area 623.

In addition, since the first area 621, one of the conductorized areas of the first active layer 620, is disposed to overlap the gate electrode 640, the length of the channel area 623 may be decreased, so that the mobility of electric charges may be influenced. However, in the transistor Tr according to embodiments, the channel area 623 may be expanded toward the area in which the channel area 623 of the first active layer 620 does not overlap the gate electrode 640, i.e. the second area 622, so that the electron mobility of the transistor Tr may be prevented from reduced.

The positions of the first area 621, the second area 622, and the channel area 623 of the first active layer 620 will be discussed in detail as follows with reference to processing diagrams.

FIGS. 7 to 10 are diagrams schematically illustrating a process of fabricating the first active layer and the gate electrode of the transistor illustrated in FIG. 6 according to an embodiment.

In the following, descriptions of some features (e.g. components or effects) may be omitted in a case in which they are the same as those of the above-described embodiments.

Figure 7:
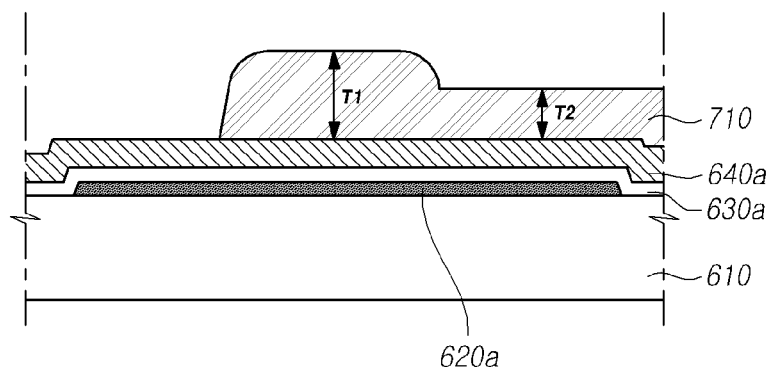
FIGS. 7 to 10 are diagrams schematically illustrating a process of fabricating the first active layer and the gate electrode of the transistor illustrated in FIG. 6 according to an embodiment.

Referring to FIG. 7, a first active layer material 620a may be disposed on the substrate 610. After the first active layer material 620a is provided on the entirety of one surface of the substrate 610, the first active layer material 620a may be patterned to be present in a specific area, as illustrated in FIG. 7.

A gate insulating film material 630a may be provided on the first active layer material 620a.

The gate insulating film material 630a may be provided on the entirety of the surface of the substrate 610.

A gate electrode material 640a may be provided on the gate insulating film material 630a.

A photoresist 710 may be disposed on the gate electrode material 640*a*.

The photoresist 710 may be disposed to expose a portion of the top surface of the gate electrode material 640*a*.

In addition, the photoresist 710 may have different thicknesses according to areas thereof. For example, the photoresist 710 may include an area having a first thickness T1 and an area having a second thickness T2, where the first thickness T1 is thicker than the second thickness T2.

The area in which the photoresist 710 is disposed to expose a portion of the top surface of the gate electrode material 640*a* may be an area including an area in which the first area 621 of the first active layer 620 illustrated in FIG. 6 is disposed.

The area in which the photoresist 710 has the first thickness T1 may be an area corresponding to the area in which the gate electrode 640 is disposed, illustrated in FIG. 6.

The area in which the photoresist 710 has the second thickness T2 may be an area including portions of the second area 622 and the channel area 623 of the first active layer 620, illustrated in FIG. 6.

Afterwards, the dry etching for patterning the gate electrode material 640*a* and the gate insulating film material 630*a* may be performed.

Figure 8:
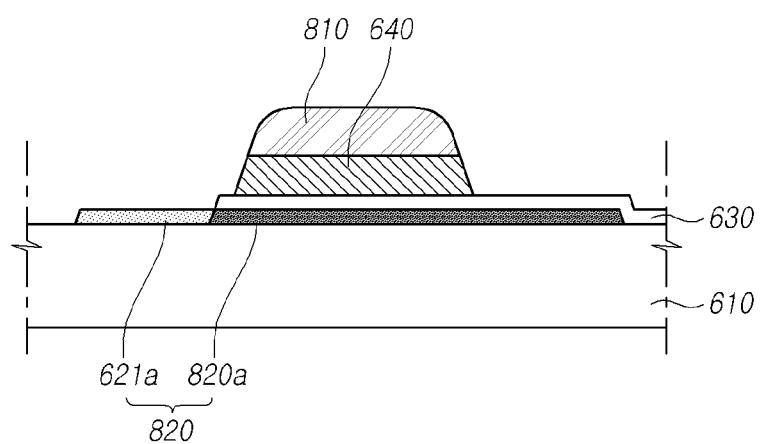

The dry etching performed using the photoresist 710 as a mask may produce a structure as illustrated in FIG. 8.

Specifically, in the area in which the photoresist 710 is absent in FIG. 7, the gate electrode material 640*a* and the gate insulating film material 630*a* may be removed by the dry etching, thereby providing the gate electrode 640 and the gate insulating film 630 illustrated in FIG. 8.

The top and side surfaces of the first active layer material 820 disposed in the area from which the gate electrode material 640*a* and the gate insulating film material 630*a* are removed may be exposed, as illustrated in FIG. 8.

In addition, a portion of the first active layer material 820, the top and side surfaces of which are exposed, may be converted into a conductorized area 621*a* by the dry etching. That is, the conductorized area may be present only in one edge portion of the first active layer material 820.

Here, the gate insulating film 630 disposed on the first active layer material 820 may be provided such that a portion of the top surface of one edge of the gate insulating film 630 is exposed from the gate electrode 640. The other edge of the gate insulating film 630 may extend to a portion of the top surface of the substrate 610, on which the first active layer material 820 is absent, while surrounding the top and side surfaces of the first active layer material 820.

In addition, the area of the photoresist 710 having the first thickness T1, illustrated in FIG. 7, may be reduced in thickness by the dry etching, as illustrated in FIG. 8.

The area of the photoresist 710 having the second thickness T2, illustrated in FIG. 7, may be removed after the dry etching, thereby providing a photoresist pattern 810. Accordingly, the top and side surfaces of the area of the gate insulating film 630, in which the portion of the photoresist 710 having the second thickness T2 has been disposed, may be exposed, as illustrated in FIG. 8.

Figure 9:
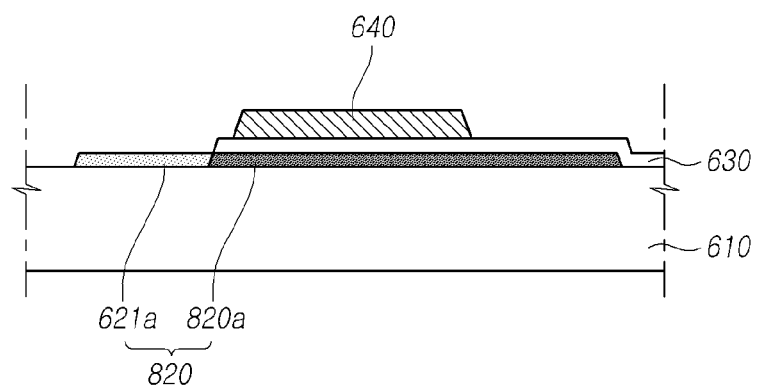

Afterwards, the photoresist pattern 810 remaining on the gate electrode 640 is removed, the top and side surfaces of the gate electrode 640 may be exposed, as illustrated in FIG. 9.

Figure 10:
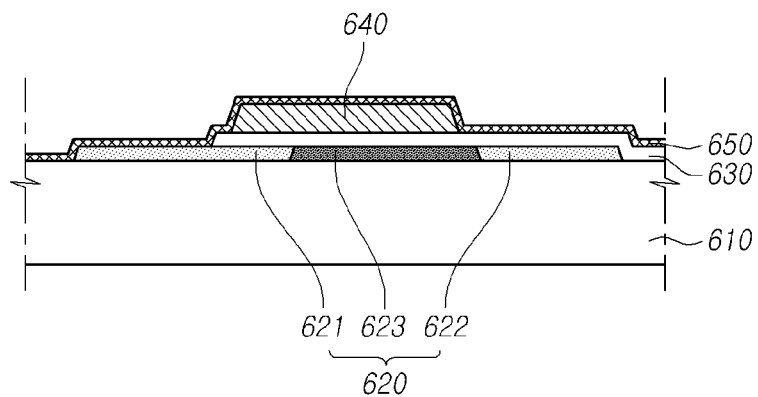

Thereafter, as illustrated in FIG. 10, the insulating film 650 may be disposed on the substrate 610 on which the gate electrode 640 is disposed.

The insulating film 650 may extend to be in contact with a portion of the top surface and with the side surface of the area (621*a* in FIG. 8) of the first active layer material, conductorized by the dry etching, and to be in contact with at least one side surface of the gate insulating film 630 and the top and side surfaces of the gate electrode 640. In addition, the insulating film 650 may be in contact with the surface of the gate insulating film 630 provided in the area not overlapping the gate electrode 640.

Here, the insulating film 650 may contain hydrogen. Hydrogen contained in the insulating film 650 may arrive at the first active layer material disposed below the insulating film 650.

Consequently, the size of the area (621*a* in FIG. 8) conductorized in the formation of the gate insulating film 630 may be increased by hydrogen diffused from the insulating film 650, and finally provide the first area 621 of the first active layer 620, as illustrated in FIG. 10.

The first area 621 of the first active layer 620 formed by the above-described process may be provided in not only the area not overlapping the gate insulating film 630 but also the areas below the gate insulating film 630 and the gate electrode 640.

In addition, the second area 622 on one edge of the first active layer 620, spaced apart from the first area 621 of the first active layer 620, may be conductorized by the diffusion of hydrogen from the insulating film 650.

In addition, since the gate insulating film 630 is disposed between the second area 622 of the first active layer 620 and the insulating film 650, hydrogen supplied from the insulating film 650 may arrive at the second area 622 of the first active layer 620 through the gate insulating film 630.

The length of the second area 622 of the first active layer 620 may be smaller than the length of the first area 621. The second area 622 may be disposed not to overlap the gate electrode 640. Here, the lengths of the first area 621 and the second area 622 of the first active layer 620 may be minimum lengths in the direction perpendicular to the direction in which the first active layer 620 and the gate insulating film 630 are stacked.

In addition, in the area of the first active layer 620 overlapping the gate electrode 640, hydrogen diffusing from the insulating film 650 may be blocked by the gate electrode 640 so as not to arrive at the first active layer 620. Accordingly, the portion of the area of the first active layer 620 overlapping a portion of the gate electrode 640 may not be supplied with hydrogen serving as carriers from the insulating film 650, thereby providing the channel area 623 with higher electric resistance than each of the first and second areas 621 and 622.

In addition, the channel area 623 may extend to a portion of the first active layer 620 not overlapping the gate electrode 640.

The portion of the first active layer 620, not overlapping the gate electrode 640, may be an area having lower electric resistance than the second area 622, since hydrogen supplied from the insulating film 650 is prevented from diffusing by the gate electrode 640.

That is, the channel area 623 of the first active layer 620 may include a portion overlapping a portion of the gate electrode 640 and a portion not overlapping the gate electrode 640.

The electric resistance of the channel area 623 of the first active layer 620 may be higher than that of each of the first and second areas 621 and 622.

In addition, the electric resistance of the portion of the channel area 623 overlapping the gate electrode 640 may differ from the electric resistance of the portion of the channel area 623 not overlapping the gate electrode 640. However, the present disclosure is not limited thereto, and the electric resistance may be the same over the entirety of the channel area 623.

In a case in which the portion of the first area 621 of the first active layer 620 overlaps the gate electrode 640, as illustrated in FIG. 10, the length of the channel area 623 may be decreased, thereby influencing the mobility of electric charges. However, according to the present disclosure, the first area 621 of the first active layer 620 may have the portion not overlapping the gate electrode 640, provided by the increased length of the first area 621 of the first active layer 620. Accordingly, the length of the channel area 623 may be substantially sufficient, thereby preventing the mobility of electric charges from being reduced.

Hereinafter, the characteristics of the transistor Tr having the above-described structure according to embodiments will be compared with those of a transistor according to a comparative example.

Figure 11:
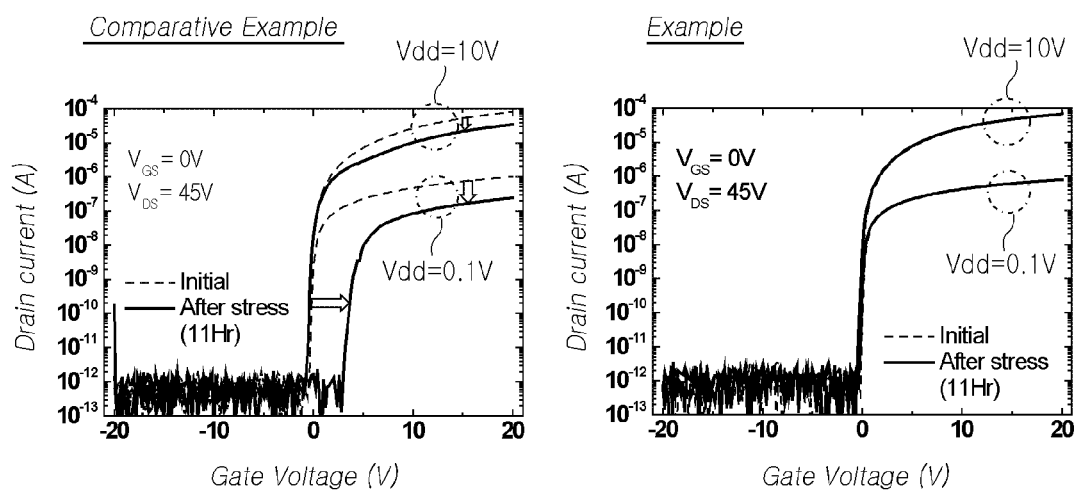
FIG. 11 is a graph comparing the characteristics of the transistor having the structure of FIG. 6 according to an embodiment with the characteristics of the transistor according to a comparative example.

FIG. 11 is a graph comparing the characteristics of the transistor Tr having the structure of FIG. 6 according to an embodiment with the characteristics of the transistor according to the comparative example.

In this case, the transistor according to the comparative example may include an active layer, a gate electrode disposed on the active layer, and a source electrode and a drain electrode disposed on the gate electrode and electrically connected to the active layer. According to the structure of the transistor, a gate insulating film may be disposed between the active layer and the gate electrode, and the entire area of the gate insulating film and the entire area of the gate electrode may overlap a channel area of the active layer.

In FIG. 11, the x axis indicates a gate voltage, while the y axis indicates a drain current.

In FIG. 11, to measure the characteristics of the transistor according to the comparative example and the characteristics of the transistor according to the example, the drain current was measured by applying the gate voltage in the range of from −20V to +20V.

In the initial state in which no voltage has been applied to an electrode (e.g. a second electrode) connected to a power supply node and a gate electrode of each of the transistors, a driving voltage VDD 0.1V and a driving voltage 10V were applied to both the transistor according to the comparative example and the transistor according to the example.

In addition, a voltage of 45V was applied to the electrode connected to the power supply node of each of the transistor according to the comparative example and the transistor according to the example. After a voltage of 0V was applied to the gate electrode for 11 hours (after stress for 11 hours), a driving voltage VDD 0.1V and a driving voltage 10V were applied to both the transistors.

In a case in which the transistor according to the comparative example was driven under the above-described conditions, it may be appreciated that the on-current has been decreased and the threshold voltage Vth has been changed from the initial value.

However, in the transistor according to the example, it may be appreciated that the on-current has not been decreased and the threshold voltage Vth has not been changed from the initial value even after driving for 11 hours.

That is, it may be appreciated that the reliability of the transistor according to the example may be maintained even when a high-voltage is applied to the electrode connected to the power supply node.

The transistor Tr having the structure illustrated in FIG. 6 may be one of the transistors T1, T2, and T3 illustrated in FIGS. 3 and 4 or one of the pull-up transistor Tup and the pull-down transistor Tdown illustrated in FIG. 5.

Figure 12:
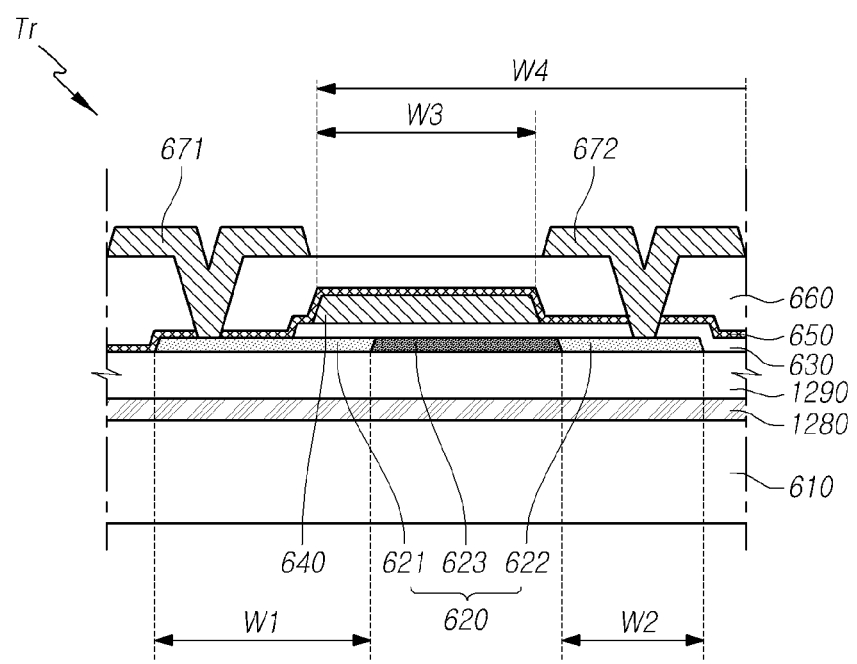
FIG. 12 is a cross-sectional view illustrating a structure of a transistor disposed in an electronic device according to other embodiments.

In particular, in a case in which the transistor Tr having the structure illustrated in FIG. 6 is the transistor T3, the transistor Tr may be have the structure as illustrated in FIG. 12.

FIG. 12 is a cross-sectional view illustrating a structure of a transistor disposed in an electronic device according to other embodiments.

In the following, descriptions of some features (e.g. components or effects) may be omitted in a case in which they are the same as those of the above-described embodiments.

Referring to FIG. 12, a light shield layer 1280 may be further disposed below the transistor Tr including the first active layer 620, the gate electrode 640, the first electrode 671, and the second electrode 672.

The composition of the light shield layer 1280 may include one selected from among aluminum (Al), gold (Au), silver (Ag), copper (Cu), tungsten (W), molybdenum (Mo), chromium (Cr), tantalum (Ta), titanium (Ti), and alloys thereof, but the present disclosure is not limited thereto.

In addition, although the light shield layer 1280 is illustrated as having a monolayer structure in FIG. 12, the present disclosure is not limited thereto. The light shield layer 1280 may have a multilayer structure.

The light shield layer 1280 may be disposed to overlap the first active layer 620 of the transistor Tr. The light shield layer 1280 may prevent the electrical characteristics of the first active layer 620 from being changed by light incident to the first active layer 620.

A buffer layer 1290 may be disposed on the light shield layer 1280.

The buffer layer 1290 may contain an inorganic insulating material, such as SiOx, SiNx, or SiON, but the present disclosure is not limited thereto.

Although the buffer layer 1290 is illustrated as having a monolayer structure in FIG. 12, the buffer layer 1290 according to the present disclosure may have a multilayer structure.

In a case in which the buffer layer 1290 has a multilayer structure, the buffer layer may have a structure in which layers respectively containing at least two inorganic insulating materials, selected from among SiOx, SiNx, and SiON, alternate with each other, but the present disclosure is not limited thereto.

In addition, although not shown in the drawings, in a case in which the transistor Tr having the structure as illustrated in FIG. 6 or 12 is a driving transistor, one electrode of the first and second electrodes 671 and 672 of the transistor Tr may be electrically connected to the pixel electrode of the electronic device.

In addition, the transistor disposed in the electronic device according to embodiments may have a different structure.

Figure 13:
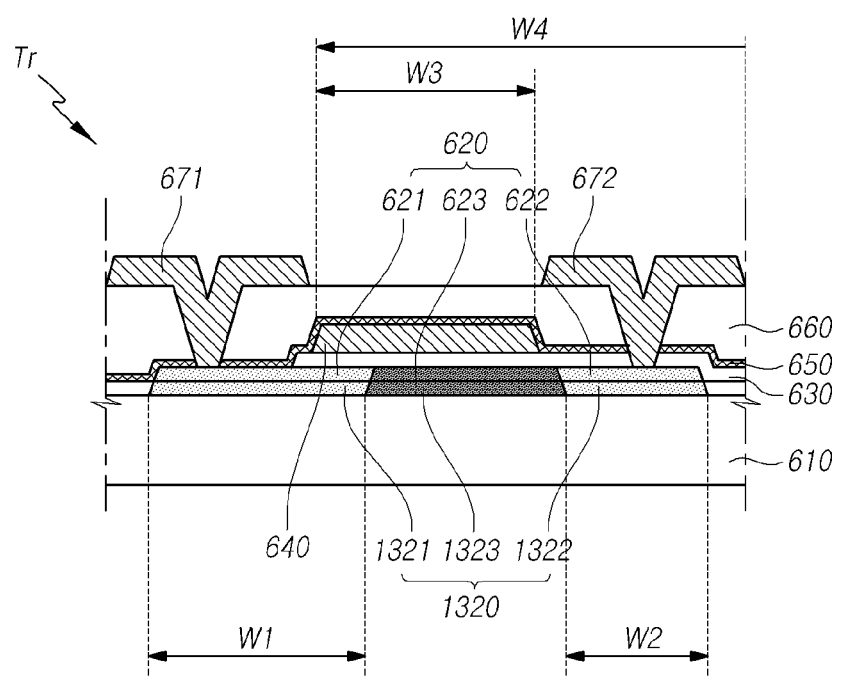
FIG. 13 is a cross-sectional view illustrating a structure of a transistor disposed in an electronic device according to other embodiments.

FIG. 13 is a cross-sectional view illustrating a structure of a transistor disposed in an electronic device according to other embodiments.

In the following, descriptions of some features (e.g. components or effects) may be omitted in a case in which they are the same as those of the above-described embodiments.

Referring to FIG. 13, the transistor Tr disposed in the electronic device according to other embodiments may further include a second active layer 1320 disposed below the first active layer 620 illustrated in FIG. 6.

The second active layer 1320 may be an oxide semiconductor.

The second active layer 1320 may include a third area 1321, a fourth area 1322 spaced apart from the third area 1321, and a channel area 1323 provided between the third area 1321 and the fourth area 1322.

Here, the third area 1321 of the second active layer 1320 may overlap the first area 621 of the first active layer 620, and the fourth area 1322 of the second active layer 1320 may overlap the second area 622 of the first active layer 620. In addition, the channel area 1323 of the second active layer 1320 may overlap the channel area 623 of the first active layer 620.

The third area 1321 of the second active layer 1320 may be conductorized due to the dry etching of the gate insulating film 630 and by hydrogen diffused from the insulating film 650 disposed on the gate electrode 640.

The fourth area 1322 of the second active layer 1320 may be conductorized by hydrogen diffused from the insulating film 650.

When viewed on the cross-section, the length of the fourth area 1322 may be shorter than the length of the third area 1321. The length of the fourth area 1322 and the length of the third area 1321 may be minimum lengths in a direction perpendicular to the direction in which the second active layer 1320 and the gate insulating film 630 are stacked.

A portion of the channel area 1323 of the second active layer 1320 may overlap the gate electrode 640, and another portion of the channel area 1323 of the second active layer 1320 may not overlap the gate electrode 640 while overlapping the gate insulating film 630 and the insulating film 650.

In addition, the thicknesses of the first active layer 620 and the gate insulating film 630 may be thin, such that hydrogen diffused from the insulating film 650 may arrive at the fourth area 1322 of the second active layer 1320.

In this regard, the first and second active layers 620 and 1320 may be fabricated by, for example, metal organic chemical vapor deposition (MOCVD) or atomic layer deposition (ALD).

Here, the MOCVD method is a subclass of chemical vapor deposition (CVD), used to fabricate a thin film by a deposition reaction on the surface of a hot substrate onto which reactant gases are injected. The reactant gases contain an organometallic complex. The MOCVD method is a technique of growing a semiconductor thin film by decomposing organometallic gases on the hot substrate by heat. The MOCVD method is performed at a lower temperature than other CVD methods, such as plasma enhanced chemical vapor deposition (PECVD) and low-pressure chemical vapor deposition (LPCVD). Thin film processing may be controlled at the atomic level, and a uniform thin film may be fabricated.

The ALD method is a subclass of CVD, used to fabricate a thin film by separately supplying reactants and depositing particles, produced by chemical reaction of reactant gases, on the surface of a substrate. After chemical adsorption of one reactant to the substrate, a second gas or a third gas is supplied to the substrate, causing subsequent chemical adsorption to the substrate, so that a thin film is deposited on the substrate.

The use of the MOCVD or ALD method may improve the productivity or growth rate of a thin film, compared physical vapor deposition (PVD) methods or other CVD methods. In addition, due to high thin film coating performance, the thickness of the thin film may be precisely adjusted.

The first and second active layers 620 and 1320 provided in this manner may contain at least one element, such as In, Ga, Zn, Ti, or Sn, as well as oxygen ($O_2$).

Here, the contents of the ingredients of the first active layer 620 may be different from those of the ingredients of the second active layer 1320. Accordingly, although the first active layer 620 and the second active layer 1320 may have different electric conductivities, the present disclosure is not limited thereto.

In a case in which the oxide semiconductor is used as an active layer of a driving transistor, the threshold voltage may be significantly shifted with changes in the channel length. Accordingly, in a case in which the oxide semiconductor is used as the active layer of the driving transistor, it may be difficult to realize a short channel while maintaining a threshold voltage value required for the electronic device.

The electronic device according to embodiments may realize the short channel while maintaining the threshold voltage value required for the electronic device by using the multilayer structure in which the two active layers are stacked, as illustrated in FIG. 13.

As described above, since the first and second active layers 620 and 1320 are stacked on each other, the first and second active layers 620 and 1320 may have a hetero junction structure.

In the junction between the first and second active layers 620 and 1320, a depletion region may be formed by built-in potential. The built-in potential $V_{bi}$ causes band bending in the junction. Due to the depletion region being provided in the junction between the first and second active layers 620 and 1320, total charge density may be controlled, thereby preventing the threshold voltage from being distorted depending on the channel length.

Although the transistor Tr having the structure illustrated in FIG. 13 may be the driving transistor T3 illustrated in FIGS. 3 and 4, the present disclosure is not limited thereto.

For example, the transistor Tr having the structure illustrated in FIG. 13 may be one of the transistors T1 and T2, illustrated in FIGS. 3 and 4, or may be one of the pull-up transsistor Tup and the pull-down transistor Tdown, illustrated in FIG. 5.

Figure 14:
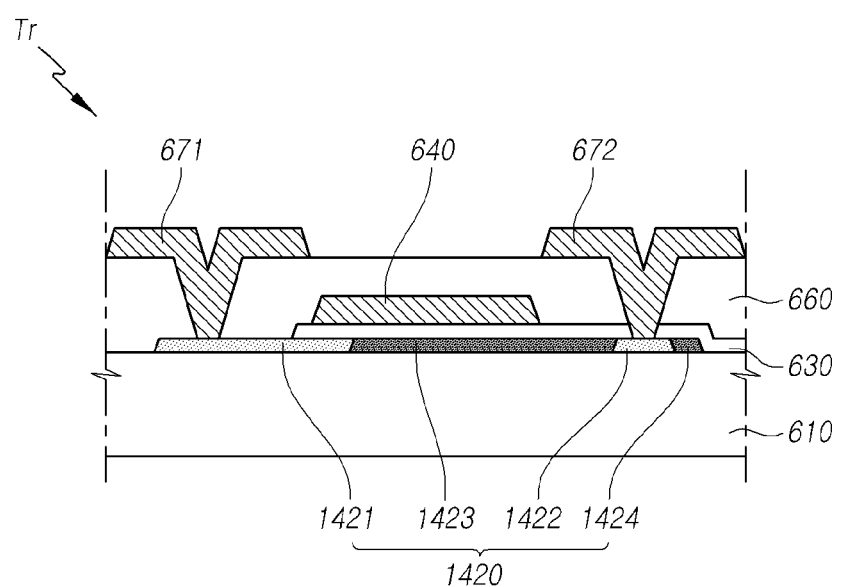
FIG. 14 is a cross-sectional view illustrating a structure of a transistor disposed in an electronic device according to other embodiments.

FIG. 14 is a cross-sectional view illustrating a structure of a transistor disposed in an electronic device according to other embodiments.

In the following, descriptions of some features (e.g. components or effects) may be omitted in a case in which they are the same as those of the above-described embodiments.

Referring to FIG. 14, the electronic device according to other embodiments may include the transistor Tr.

The transistor Tr may include a second active layer 1420, the gate electrode 640, the first electrode 671, and the second electrode 672.

As illustrated in FIG. 14, the second active layer 1420 may be disposed on the substrate 610, and the gate insulating film 630 may be disposed on the second active layer 1420. The gate electrode 640 may be disposed on the gate insulating film 630, the interlayer insulating film 660 may be disposed on the substrate 610 on which the gate electrode 640 is disposed, and the first and second electrodes 671 and 672 spaced apart from each other may be disposed on the interlayer insulating film 660.

The second active layer 1420 may be an oxide semiconductor.

The second active layer 1420 may include a first area 1421, a second area 1422, a third area 1424, and a channel area 1423.

The first area 1421 and the second area 1422 may be spaced apart from each other. One area of the first area 1421 and the second area 1422 may be disposed between the channel area 1423 and a third area 1424 spaced apart from the channel area 1423.

For example, as illustrated in FIG. 14, the channel area 1423 may be disposed between the first area 1421 and the second area 1422, and the second area 1422 may be disposed between the channel area 1423 and the third area 1424.

Here, the electric resistance between the first area 1421 and the second area 1422 may be lower than the electric resistance of each of the third area 1424 and the channel area 1423.

That is, the first area 1421 and the second area 1422 of the second active layer 1420 may be conductorized areas, and the channel area 1423 and the third area 1424 may be non-conductorized areas.

The first electrode 671 of the transistor Tr may be connected to the first area 1421 of the second active layer 1420, and the second electrode 672 of the transistor Tr may be connected to the second area 1422 of the second active layer 1420.

When viewed on the cross-section, the first area 1421 and the second area 1422, i.e. the conductorized areas, of the second active layer 1420 may have different lengths. Here, the length of the first area 1421 and the length of the second area 1422 may be minimum lengths in a direction perpendicular to a direction in which the second active layer 1420 and the gate insulating film 630 are stacked.

The first area 1421 of the second active layer 1420 may be conductorized in the dry etching for patterning the gate insulating film 630.

The second area 1422 of the second active layer 1420 may be conductorized by laser processing or the like.

The gate insulating film 630 disposed on the second active layer 1420 may overlap the entirety of one of the first area 1421 and the second area 1422, the entirety of the channel area 1423, and the entirety of the third area 1424. In addition, the area of the other of the first area 1421 and the second area 1422 of the second active layer 1420 may only overlap a portion of the gate insulating film 630.

For example, as illustrated in FIG. 14, the gate insulating film 630 may overlap the entirety of each of the second area 1422, the channel area 1423, and the third area 1424 of the second active layer 1420. In addition, the gate insulating film 630 may overlap a portion of the first area 1421 of the second active layer 1420.

A portion of the first area 1421 of the second active layer 1420 may overlap the gate electrode 640.

The width of the area in which the gate insulating film 630 overlaps the first area 1421 of the second active layer 1420 may be greater than the width of the area in which the gate electrode 640 overlaps the first area 1421 of the second active layer 1420. The width of the area in which a gate insulating film 1430 overlaps the first area 1421 of the second active layer 1420 and the width of the area in which a gate electrode 1440 overlaps the first area 1421 of the second active layer 1420 may be minimum lengths in a direction perpendicular to a direction in which the second active layer 1420 and the gate insulating film 630 are stacked.

As described above, one end of the gate insulating film 630 is disposed to be more offset than one end of the gate electrode 640, in a direction in which the first area 1421 extends from the channel area 1423. One end of the gate electrode 640 may be separated from the first area 1421 of the second active layer 1420. Accordingly, it is possible to prevent a short circuit from being generated by the contact between the gate electrode 640 and the first area 1421, i.e. the conductorized area, due to a process error or the like.

In addition, the channel area 1423 of the second active layer 1420 may include a portion overlapping the gate electrode 640 and another portion not overlapping the gate electrode 640.

In addition, the second area 1422 of the second active layer 1420 electrically connected to the second electrode 672 may be located between the non-conductorized areas, i.e. the channel area 1423 and the third area 1424.

As described above, the second area 1422 of the active layer 1420 may be disposed between the channel area 1423 and the third area 1424 while not overlapping the gate electrode 640, such that the length of the channel area 1423 is substantially sufficient.

That is, the second area 1422 of the second active layer 1420 may be located such that the length of the channel area 1423 is not excessively short.

Accordingly, the mobility of the transistor Tr may not be reduced.

In addition, in a case in which the second electrode 672 of the transistor Tr is connected to the power supply node, the gate insulating film 630 may be disposed to overlap the entirety of both the channel area 1423 and the second area 1422, so that the channel area 1423 adjacent to the second area 1422 of the second active layer 1420 connected to the second electrode 672 is not deteriorated, even when a high voltage is applied to the second electrode 672. In addition, the gate insulating film 630 may be disposed to overlap the entirety of the second area 622.

Accordingly, this may overcome the problem of degraded reliability in the transistor Tr due to the deterioration of the channel area 1423 caused by the reduced thickness of the gate insulating film 630 present between the gate electrode 640 and the channel area 1423.

Figure 15:
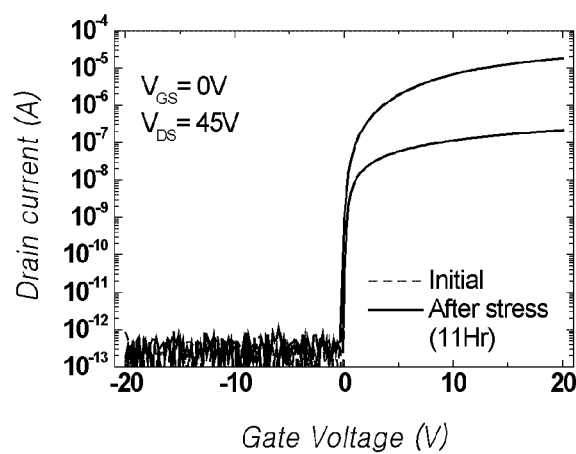
FIG. 15 is a graph illustrating characteristics of the transistor having the structure of FIG. 14.

FIG. 15 is a graph illustrating characteristics of the transistor Tr having the structure of FIG. 14.

In FIG. 15, the x axis indicates a gate voltage, while the y axis indicates a drain current.

In FIG. 15, to measure the characteristics of the transistor Tr having the structure of FIG. 14, the drain current was measured by applying the gate voltage in the range of from −20V to +20V.

In the initial state in which no voltage has been applied to an electrode (e.g. a second electrode) connected to a power supply node and a gate electrode of the transistor Tr, a driving voltage VDD 0.1V and a driving voltage 10V were applied to the transistor Tr having the structure of FIG. 14.

In addition, a voltage of 45V was applied to the electrode connected to the power supply node of the transistor Tr. After a voltage of 0V was applied to the gate electrode for 11 hours (after stress for 11 hours), a driving voltage VDD 0.1V and a driving voltage 10V were applied to both the transistors.

Referring to FIG. 14, it may be appreciated that, in the transistor Tr having the structure of FIG. 14, the on-current has not been decreased and the threshold voltage Vth has not been changed from the initial value even after driving for 11 hours.

That is, it may be appreciated that the reliability of the transistor according to embodiments may be maintained even when a high-voltage is applied to the electrode connected to the power supply node.

The transistor Tr having the structure illustrated in FIG. 14 may be one of the transistors T1, T2, and T3, as illustrated in FIGS. 3 and 4, or one of the pull-up transistor Tup and the pull-down transistor Tdown provided in control switch circuit CSC, as illustrated in FIG. 5.

Specifically, the transistor Tr according to embodiments may be the transistor T3, as illustrated in FIG. 3 or 4, among the transistors disposed in the active area. Here, a high voltage (e.g. a driving voltage) is applicable to the transistor Tr.

In addition, the transistor Tr according to embodiments may be at least one of the pull-up transistor to which a high voltage (e.g. a clock signal) is applicable and the transistor provided in the control switch circuit among the transistors disposed in the nonactive area.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. An electronic device comprising:
   a panel including at least one transistor; and
   a driving circuit driving the panel,
   wherein the panel includes:
      a substrate;
      a first active layer disposed on the substrate, the first active layer including a first area, a second area spaced apart from the first area, and a channel area provided between the first area and the second area, wherein the first active layer is an oxide semiconductor and each of the first area and the second area of the first active layer is conductorized area, and wherein an electric resistance of each of the first area and the second area is lower than an electric resistance of the channel area;
      a gate insulating film disposed on the first active layer;
      a gate electrode of the at least one transistor disposed on the gate insulating film and overlapping a portion of the channel area of the first active layer;
      an interlayer insulating film disposed on the gate electrode; and
      a first electrode and a second electrode of the at least one transistor disposed on the interlayer insulating film and spaced apart from each other,
      wherein the gate electrode overlaps a portion of at least one area of the first area and the second area of the first active layer.

2. The electronic device according to claim 1, wherein the first area is connected to the first electrode, and the second area is connected to the second electrode.

3. The electronic device according to claim 1, wherein a portion of the first area overlaps the gate electrode, and
   wherein the second area does not overlap the gate electrode.

4. The electronic device according to claim 3, wherein a width of the first area is greater than a width of the second area.

5. The electronic device according to claim 3, wherein the first area is connected to the first electrode,
   wherein the second area is connected to the second electrode, and
   wherein the second electrode is electrically connected to a power supply node of the electronic device.

6. The electronic device according to claim 3, wherein the gate insulating film overlaps another portion of the first area, an entirety of the channel area, and at least a portion of the second area of the first active layer.

7. The electronic device according to claim 1, the channel area of the first active layer is disposed asymmetrically about the center of the gate electrode.

8. The electronic device according to claim 1, further comprising an insulating film disposed between the gate electrode and the interlayer insulating film,
   wherein the insulating film is in contact with a portion of a surface of the first area or the second area of the first active layer and in contact with a portion of a top surface of the gate insulating film overlapping the first area and the second area of the first active layer.

9. The electronic device according to claim 8, wherein the insulating film contains hydrogen.

10. The electronic device according to claim 1, wherein the portion of the channel area of the first active layer overlaps the gate electrode.

11. The electronic device according to claim 1, wherein the first active layer further comprises a third area spaced apart from the channel area, and the second area is disposed between the channel area and the third area.

12. The electronic device according to claim 11, wherein an electric resistance of each of the first area and the second area is lower than an electric resistance of each of the third area and the channel area.

13. The electronic device according to claim 12, wherein the first area is connected to the first electrode, and the second area is connected to the second electrode.

14. The electronic device according to claim 11, wherein the gate insulating film overlaps an entirety of the one area of the first area and the second area, an entirety of the channel area, and an entirety of the third area.

15. The electronic device according to claim 14, wherein a portion of another area of the first area and the second area overlaps the gate insulating film.

16. The electronic device according to claim 1, further comprising a second active layer disposed below the first active layer,
   wherein the second active layer includes:
      a fourth area overlapping the first area of the first active layer;
      a fifth area overlapping the second area of the first active layer; and
      another channel area provided between the fourth area and the fifth area;
      wherein the another channel area of the second active layer overlaps the channel area of the first active layer.

17. The electronic device according to claim 16, wherein the fourth area and the fifth area of the second active layer are conductorized areas, and wherein the gate electrode overlaps a portion of at least one area of the fourth area and the fifth area of the second active layer.

18. The electronic device according to claim 16, wherein a portion of the another channel area of the second active layer overlaps the gate electrode, and
wherein an entirety of the another channel area of the second active layer overlaps the gate insulating film.

19. The electronic device according to claim 1, wherein the panel includes an active area and a nonactive area surrounding the active area, and
wherein the transistor is at least one of a driving transistor disposed in the active area, a pull-up transistor disposed in the nonactive area, or a transistor provided in a control switch circuit.

20. A transistor array substrate comprising:
a substrate on which a transistor array constituting a plurality of transistors is formed;
a first active layer disposed on the substrate, the first active layer including a first area, a second area spaced apart from the first area, and a channel area provided between the first area and the second area, wherein the first active layer is an oxide semiconductor and each of the first area and the second area of the first active layer is conductorized area, and wherein an electric resistance of each of the first area and the second area is lower than an electric resistance of the channel area;
a gate insulating film disposed on the first active layer;
a gate electrode disposed on the gate insulating film and overlapping a portion of the channel area of the first active layer;
an interlayer insulating film disposed on the gate electrode; and
a first electrode and a second electrode disposed on the interlayer insulating film and spaced apart from each other,
wherein the gate electrode overlaps a portion of at least one area of the first area and the second area of the first active layer.

21. A transistor comprising:
a substrate;
a first active layer disposed on the substrate, the first active layer including a first area, a second area spaced apart from the first area, and a channel area provided between the first area and the second area, wherein the first active layer is an oxide semiconductor and each of the first area and the second area of the first active layer is conductorized area, and wherein an electric resistance of each of the first area and the second area is lower than an electric resistance of the channel area;
a gate insulating film disposed on the first active layer;
a gate electrode disposed on the gate insulating film and overlapping a portion of the channel area of the first active layer;
an interlayer insulating film disposed on the gate electrode; and
a source electrode and a drain electrode disposed on the interlayer insulating film and spaced apart from each other,
wherein the gate electrode overlaps a portion of at least one area of the first area and the second area of the first active layer, and
wherein the source electrode is connected to the first area of the first active layer and the drain electrode is connected to the second area of the first active layer.

\* \* \* \* \*